US010025708B1

(12) United States Patent
Hu

(10) Patent No.: US 10,025,708 B1
(45) Date of Patent: Jul. 17, 2018

(54) MEMORY MANAGEMENT METHOD, MEMORY CONTROL CIRCUIT UNIT AND MEMORY STORAGE APPARATUS

(71) Applicant: PHISON ELECTRONICS CORP., Miaoli (TW)

(72) Inventor: Chun-Yang Hu, Taoyuan (TW)

(73) Assignee: PHISON ELECTRONICS CORP., Miaoli (TW)

( * ) Notice: Subject to any disclaimer, the term of this patent is extended or adjusted under 35 U.S.C. 154(b) by 0 days.

(21) Appl. No.: 15/805,148

(22) Filed: Nov. 7, 2017

(30) Foreign Application Priority Data

Sep. 8, 2017 (TW) .............................. 106130891 A

(51) Int. Cl.
*G06F 12/02* (2006.01)
*G06F 3/06* (2006.01)
*G11C 16/16* (2006.01)

(52) U.S. Cl.
CPC ........ *G06F 12/0246* (2013.01); *G06F 3/0604* (2013.01); *G06F 3/0652* (2013.01); *G06F 3/0659* (2013.01); *G06F 12/0253* (2013.01); *G11C 16/16* (2013.01); *G06F 2212/7201* (2013.01); *G06F 2212/7205* (2013.01)

(58) Field of Classification Search
CPC .... G06F 3/0604; G06F 3/0652; G06F 3/0659; G06F 12/023; G06F 12/0238; G06F 12/0246; G06F 12/0253; G06F 12/0261; G06F 12/0269; G06F 12/0296; G06F 12/0276; G06F 2212/7201; G06F 2212/7205; G11C 16/16; G11C 2216/18
See application file for complete search history.

(56) References Cited

U.S. PATENT DOCUMENTS

| 9,582,416 | B2* | 2/2017 | Yeh ..................... G06F 12/0246 |
| 2015/0347295 | A1* | 12/2015 | Ihm ..................... G06F 12/0253 |
| | | | 711/103 |

* cited by examiner

*Primary Examiner* — Harry W Byrne
*Assistant Examiner* — R Lance Reidlinger
(74) *Attorney, Agent, or Firm* — JCIPRNET

(57) ABSTRACT

A memory management method, and a memory control circuit unit and a memory storage apparatus using this method are provided. The method includes performing a first garbage collection operation corresponding to a data area if the number of physical erasing units associated with the data area is larger than a first threshold; performing a second garbage collection operation corresponding to a table area if the number of physical erasing units associated with the table area is larger than a second threshold; and dynamically adjusting the second threshold according to the number of the physical erasing units associated with the data area.

21 Claims, 7 Drawing Sheets

MEMORY MANAGEMENT METHOD, MEMORY CONTROL CIRCUIT UNIT AND MEMORY STORAGE APPARATUS

CROSS-REFERENCE TO RELATED APPLICATION

This application claims the priority benefit of Taiwan application serial no. 106130891, filed on Sep. 8, 2017. The entirety of the above-mentioned patent application is hereby incorporated by reference herein and made a part of this specification.

BACKGROUND

Field of the Invention

The disclosure relates to a memory management method for a rewritable non-volatile memory, and a memory control circuit unit and a memory storage apparatus using this method.

Description of Related Art

As digital cameras, mobile phones, and MP3 players have been growing rapidly in recent years, consumers' demand for storage media has also been growing significantly. With characteristics including data non-volatility, energy saving, small size, lack of mechanical structures, etc., rewritable non-volatile memory modules (e.g., flash memories) are ideal to be built-in in various portable multi-media apparatuses such as those listed above.

A flash memory module includes a plurality of physical erasing units, and each physical erasing unit includes a plurality of physical programming units, wherein when data are written to a physical erasing unit, the data must be written according to a sequence of the physical programming units. Moreover, a physical programming unit written with data must be erased before it can be used again for writing data. Particularly, the physical erasing unit is the smallest unit for erasing, and the physical programming unit is the smallest unit for programming (also referred to as writing).

In management of a flash memory module, after initializing of a memory storage apparatus is completed, a memory management circuit places the empty physical erasing units in a spare area. When executing write commands from a host system, the memory management circuit selects one physical erasing unit from the spare area, writes user data from the host system to this physical erasing unit, and associates this physical erasing unit with a data area (for example, recording mapping information between logical pages and the physical programming units in a logical address-physical address mapping table). Moreover, since relevant system table data have also been updated (e.g., logical address-physical address mapping tables) when the write commands are executed, the memory management circuit selects one physical erasing unit from the spare area, writes the system table data to this physical erasing unit, and associates this physical erasing unit with a table area (for example, recording the physical erasing unit storing the logical address-physical address mapping table in a queue table of the table area). During operation of the memory storage apparatus, as the host system issues the write commands, the user data and the system management table data are updated, and the physical erasing units that do not store valid data in the data area and the table area are re-associated with the spare area, such that the physical erasing units constantly alternate for writing the user data and the system management table data.

As the physical erasing units are constantly used in an alternate manner, the memory management circuit has to reserve a specific number of the physical erasing units so as to successfully perform the writing operations. Therefore, the memory management circuit monitors the number of the physical erasing units used for the data area and the number of the physical erasing units used for the table area, and performs a garbage collection operation (also referred to as a valid data merge operation) accordingly to avoid exhaustion of the physical erasing units in the spare area. For example, if the number of the physical erasing units in the data area is larger than a predetermined fixed data area threshold, the memory management circuit performs the garbage collection operation on the physical erasing units in the data area to aggregate the valid data on multiple physical erasing units in the data area into one empty physical erasing unit and re-associate the physical erasing units that do not store valid data with the spare area. Accordingly, the number of the physical erasing units in the data area is reduced, and the number in the spare area is restored. Similarly, if the number of the physical erasing units in the table area is larger than a predetermined fixed table area threshold, the memory management circuit performs the garbage collection operation on the physical erasing units in the table area to aggregate the valid data on multiple physical erasing units in the table area into one empty physical erasing unit and re-associate the physical erasing units that do not store valid data with the spare area. Since it takes some time to perform the garbage collection operation, a delay in executing the write commands may be caused.

Generally, among the data stored in the memory storage apparatus, an amount of the system management table data is far less than an amount of the user data. Therefore, the number of the physical erasing units reserved for the table area is far smaller than the number of the physical erasing units reserved for the data area. However, as the host system writes data to scattered logical addresses (i.e., random writing), the number of the physical erasing units in the table area is rapidly increased (namely, the physical erasing units reserved for the table area are rapidly consumed). As a result, although the memory storage apparatus merely stores a small amount of user data, it is still required to start performing the garbage collection operation on the physical erasing units in the table area, which affects writing performance of the memory storage apparatus. Accordingly, how to effectively perform the garbage collection operation is one of the aims people skilled in the art seek to attain.

Nothing herein should be construed as an admission of knowledge in the prior art of any portion of the present invention. Furthermore, citation or identification of any document in this application is not an admission that such document is available as prior art to the present invention, or that any reference forms a part of the common general knowledge in the art.

SUMMARY

The disclosure provides a memory management method, a memory storage apparatus, and a memory control circuit unit capable of effectively using spare physical erasing units, postponing execution of a garbage collection operation, and enhancing performance of executing write commands.

An exemplary embodiment of the disclosure provides a memory management method for a rewritable non-volatile memory module, wherein the rewritable non-volatile memory module includes a plurality of physical erasing units associated at least with a data area, a spare area, or a table area. The memory management method includes: performing a first garbage collection operation corresponding to the data area if the number of the physical erasing units associated with the data area is larger than a first threshold; performing a second garbage collection operation corresponding to the table area if the number of the physical erasing units associated with the table area is larger than a second threshold; and dynamically adjusting the second threshold according to the number of the physical erasing units associated with the data area.

An exemplary embodiment of the disclosure provides a memory control circuit unit configured to control a rewritable non-volatile memory module including a plurality of physical erasing units. The memory control circuit unit includes a host interface, a memory interface, and a memory management circuit. The host interface is configured to couple to a host system. The memory interface is configured to couple to the rewritable non-volatile memory module. The memory management circuit is coupled to the host interface and the memory interface. The memory management circuit is configured to associate the physical erasing units at least with a data area, a spare area, or a table area. Moreover, the memory management circuit is further configured to perform a first garbage collection operation corresponding to the data area if the number of the physical erasing units associated with the data area is larger than a first threshold, and perform a second garbage collection operation corresponding to the table area if the number of the physical erasing units associated with the table area is larger than a second threshold. In addition, the memory management circuit is further configured to dynamically adjust the second threshold according to the number of the physical erasing units associated with the data area, wherein the second threshold decreases as the number of the physical erasing units in the data area increases and the second threshold is not smaller than a predetermined value.

An exemplary embodiment of the disclosure provides a memory storage apparatus including a connection interface unit, a rewritable non-volatile memory module, and a memory control circuit unit. The connection interface unit is configured to couple to a host system. The rewritable non-volatile memory module includes a plurality of physical erasing units. The memory control circuit unit is coupled to the connection interface unit and the rewritable non-volatile memory module. The memory control circuit unit is configured to associate the physical erasing units at least with a data area, a spare area, or a table area. Moreover, the memory control circuit unit is further configured to perform a first garbage collection operation corresponding to the data area if the number of the physical erasing units associated with the data area is larger than a first threshold, and perform a second garbage collection operation corresponding to the table area if the number of the physical erasing units associated with the table area is larger than a second threshold. In addition, the memory control circuit unit is further configured to dynamically adjust the second threshold according to the number of the physical erasing units associated with the data area, wherein the second threshold decreases as the number of the physical erasing units in the data area increases and the second threshold is not smaller than a predetermined value.

In light of the above, the memory management method, the memory control circuit unit, and the memory storage apparatus of the exemplary embodiments dynamically adjust the second threshold, which correspondingly limits the number of the physical erasing units in the table area, such that the physical erasing units that have not been used to write user data in the spare area can be used to store management table data. Accordingly, the disclosure effectively uses spare physical erasing units, postpones execution of the garbage collection operation, and enhances performance of executing write commands.

To provide a further understanding of the aforementioned and other features and advantages of the disclosure, exemplary embodiments, together with the reference drawings, are described in detail below.

DESCRIPTION OF THE EMBODIMENTS

Figure 1:
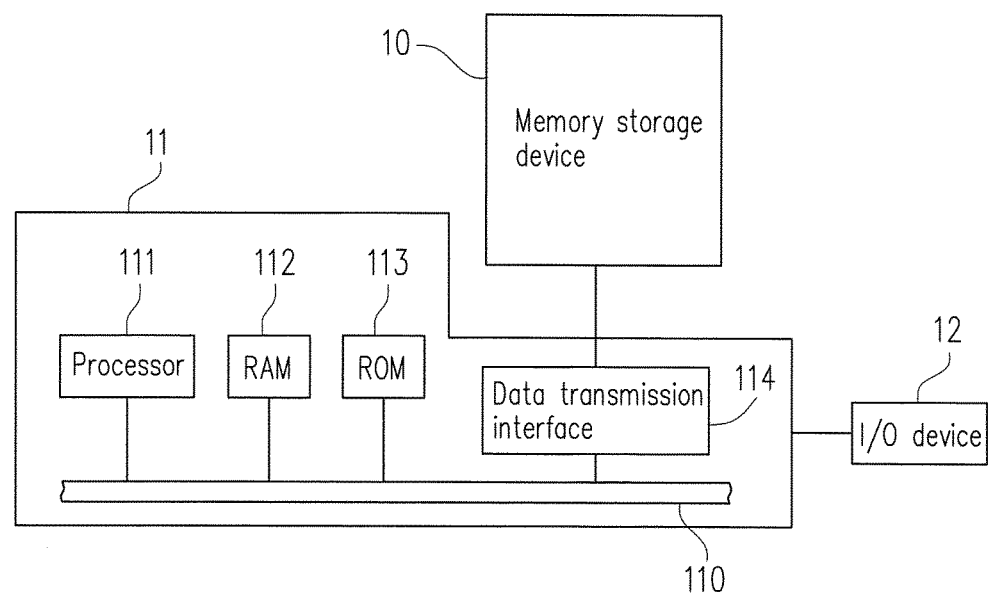
FIG. 1 is a schematic diagram illustrating a host system, a memory storage apparatus, and an input/output (I/O) device according to an exemplary embodiment.

Reference will now be made in detail to the present preferred embodiments of the disclosure, examples of which are illustrated in the accompanying drawings. Wherever possible, the same reference numbers are used in the drawings and the description to refer to the same or like parts.

Embodiments of the present invention may comprise any one or more of the novel features described herein, including in the Detailed Description, and/or shown in the drawings. As used herein, "at least one", "one or more", and "and/or" are open-ended expressions that are both conjunctive and disjunctive in operation. For example, each of the expressions "at least on of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

It is to be noted that the term "a" or "an" entity refers to one or more of that entity. As such, the terms "a" (or "an"), "one or more" and "at least one" can be used interchangeably herein.

Generally, a memory storage apparatus (also referred to as a memory storage system) includes a rewritable non-volatile memory module and a controller (also referred to as a control circuit unit). The memory storage apparatus is usually used together with a host system, such that the host system can write data to the memory storage apparatus or read data from the memory storage apparatus.

Figure 2:
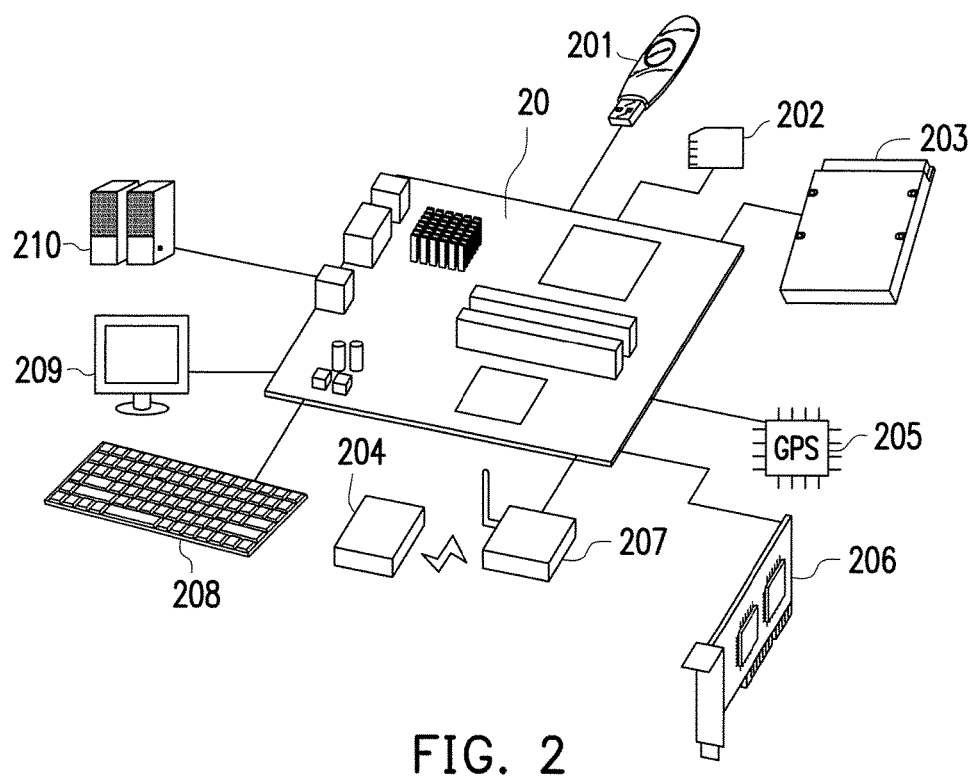
FIG. 2 is a schematic diagram illustrating a host system, a memory storage apparatus, and an input/output (I/O) device according to another exemplary embodiment.

FIG. 1 is a schematic diagram illustrating a host system, a memory storage apparatus, and an input/output (I/O)

device according to an exemplary embodiment, and FIG. 2 is a schematic diagram illustrating a host system, a memory storage apparatus, and an input/output (I/O) device according to another exemplary embodiment.

Referring to FIG. 1 and FIG. 2, a host system 11 generally includes a processor 111, a random access memory (RAM) 112, a read only memory (ROM) 113, and a data transmission interface 114. The processor 111, the random access memory 112, the read only memory 113, and the data transmission interface 114 are all coupled to a system bus 110.

In the present exemplary embodiment, the host system 11 is coupled to a memory storage apparatus 10 via the data transmission interface 114. For example, the host system 11 may write data to the memory storage apparatus 10 or read data from the memory storage apparatus 10 via the data transmission interface 114. Moreover, the host system 11 is coupled to the I/O device 12 via the system bus 110. For example, the host system 11 may transmit output signals to the I/O device 12 or receive input signals from the I/O device 12 via the system bus 110.

In the present exemplary embodiment, the processor 111, the random access memory 112, the read only memory 113, and the data transmission interface 114 may be installed on a motherboard 20 of the host system 11. The number of the data transmission interface 114 may be one or more. The motherboard 20 may be coupled to the memory storage apparatus 10 via the data transmission interface 114 through wired or wireless manners. The memory storage apparatus 10 is, for example, a flash drive 201, a memory card 202, a solid state drive (SSD) 203, or a wireless memory storage apparatus 204. The wireless memory storage apparatus 204 is, for example, a memory storage apparatus based on various wireless communication technologies, such as a near field communication (NFC) memory storage apparatus, a WiFi memory storage apparatus, a Bluetooth memory storage apparatus, or a low power Bluetooth memory storage apparatus (e.g., iBeacon). Moreover, the motherboard 20 may also be coupled via the system bus 110 to various I/O devices, such as a global positioning system (GPS) module 205, a network interface card 206, a wireless transmission device 207, a keyboard 208, a screen 209, and a speaker 210. For example, in an exemplary embodiment, the motherboard 20 may access the wireless memory storage apparatus 204 via the wireless transmission device 207.

Figure 3:
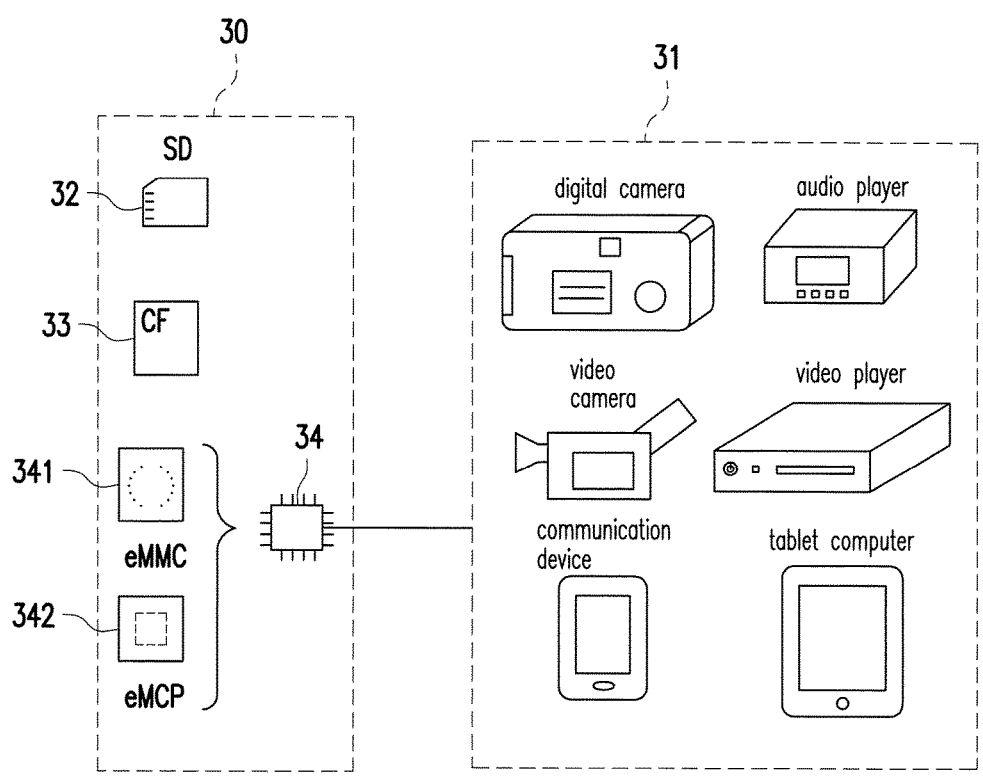
FIG. 3 is a schematic diagram illustrating a host system and a memory storage apparatus according to another exemplary embodiment.

In an exemplary embodiment, the foregoing host system is any system that substantially works with the memory storage apparatus to store data. In the exemplary embodiment above, the host system is illustrated with a computer system. However, FIG. 3 is a schematic diagram illustrating a host system and a memory storage apparatus according to another exemplary embodiment. Referring to FIG. 3, in another exemplary embodiment, a host system 31 may also be a system such as a digital camera, a video camera, a communication device, an audio player, a video player, a tablet computer, etc., and a memory storage apparatus 30 is any one of various types of non-volatile memory storage apparatuses used by the host system 31, such as a secure digital (SD) card 32, a compact flash (CF) card 33, an embedded storage apparatus 34, etc. The embedded storage apparatus 34 is any of various types of embedded storage apparatuses directly coupling a memory module to a substrate of the host system, such as an embedded multi media card (eMMC) 341 and/or an embedded multi chip package (eMCP) storage apparatus 342.

Figure 4:
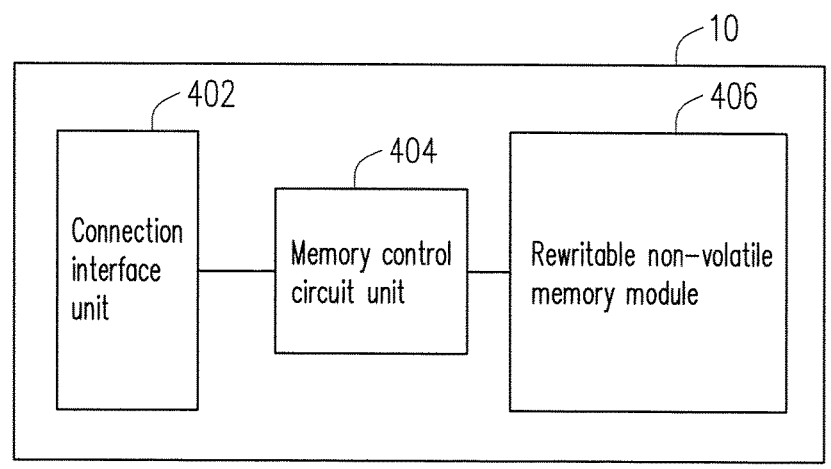
FIG. 4 is a schematic block diagram illustrating a host system and a memory storage apparatus according to an exemplary embodiment.

FIG. 4 is a schematic block diagram illustrating a host system and a memory storage apparatus according to an exemplary embodiment.

Referring to FIG. 4, the memory storage apparatus 10 includes a connection interface unit 402, a memory control circuit unit 404, and a rewritable non-volatile memory module 406.

In the present exemplary embodiment, the connection interface unit 402 is compatible with the Secure Digital (SD) interface standard. However, it is understood that the disclosure is not limited hereto. The connection interface unit 402 may also be compatible with the Serial Advanced Technology Attachment (SATA) standard, the Parallel Advanced Technology Attachment (PATA) standard, the Institute of Electrical and Electronic Engineers (IEEE) 1394 standard, the Peripheral Component Interconnect Express (PCI Express) standard, the Universal Serial Bus (USB) standard, the Ultra High Speed-I (UHS-I) interface standard, the Ultra High Speed-II (UHS-II) interface standard, the Memory Stick (MS) interface standard, the Multi-Chip Package interface standard, the Multi Media Card (MMC) interface standard, the embedded Multi Media Card (eMMC) interface standard, the Universal Flash Storage (UFS) interface standard, the embedded Multi Chip Package (eMCP) interface standard, the Compact Flash (CF) interface standard, the Integrated Device Electronics (IDE) standard, or other suitable standards. In the present exemplary embodiment, the connection interface unit 402 may be packaged with the memory control circuit unit 404 in one single chip, or the connection interface unit 402 may be disposed outside a chip including the memory control circuit unit 404.

The memory control circuit unit 404 is configured to execute a plurality of logic gates or control commands implemented in a hardware form or a firmware form and perform operations, such as data writing, reading, erasing, etc., in the rewritable non-volatile memory module 406, according to commands of the host system 11.

The rewritable non-volatile memory module 406 is coupled to the memory control circuit unit 404 and is configured to store data written by the host system 11. The rewritable non-volatile memory module 406 includes physical erasing units 410(0) to 410(N). For example, the physical erasing units 410(0) to 410(N) may belong to one single memory die or belong to different memory dies. Each physical erasing unit respectively includes a plurality of physical programming units, wherein the physical programming units belonging to the same physical erasing unit may be written independently and erased simultaneously. However, it is understood that the disclosure is not limited hereto, and each physical erasing unit may be constituted by 64 physical programming units, 256 physical programming units, or physical programming units of any other numbers.

More specifically, the physical erasing unit is the smallest unit for erasing. Namely, each physical erasing unit contains the least number of memory cells to be erased altogether. The physical programming unit is the smallest unit for programming. Namely, the physical programming unit is the smallest unit for writing data. Each physical programming unit usually includes a data bit area and a redundant bit area. The data bit area includes a plurality of physical access addresses for storing user data, and the redundant bit area is configured for storing system data (e.g., control information and error correcting codes). In the present exemplary embodiment, each data bit area of the physical programming unit includes 8 physical access addresses, and the size of each physical access address is 512 bytes. However, in other exemplary embodiments, greater or smaller numbers of the physical access addresses may be included in the data bit area, and the size and the number of the physical access addresses are not limited in the disclosure. For example, in an exemplary embodiment, the physical erasing units are physical blocks, and the physical programming units are physical pages or physical sectors, but the disclosure is not limited hereto.

In the present exemplary embodiment, the rewritable non-volatile memory module 406 is a single level cell (SLC) NAND flash memory module (i.e., a flash memory module capable of storing 1 data bit in one memory cell). However, the disclosure is not limited hereto, and the rewritable non-volatile memory module 406 may also be a multi level cell (MLC) NAND flash memory module (i.e., a flash memory module capable of storing 2 data bits in one memory cell), a trinary level cell (TLC) NAND flash memory module (i.e., a flash memory module capable of storing 3 data bits in one memory cell), or any other memory modules with the same characteristics.

Figure 5:
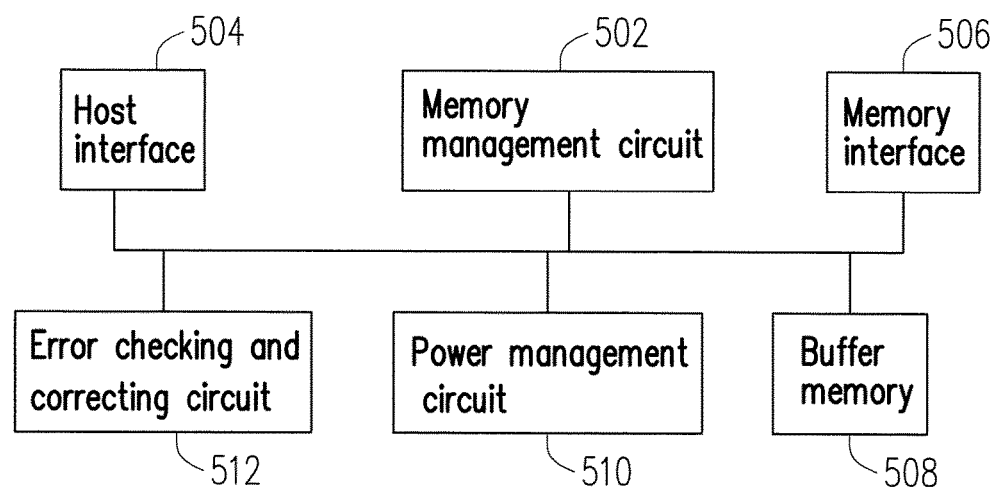
FIG. 5 is a schematic block diagram illustrating a memory control circuit unit according to an exemplary embodiment.

FIG. 5 is a schematic block diagram illustrating a memory control circuit unit according to an exemplary embodiment.

Referring to FIG. 5, the memory control circuit unit 404 includes a memory management circuit 502, a host interface 504, and a memory interface 506.

The memory management circuit 502 is configured to control overall operations of the memory control circuit unit 404. Specifically, the memory management circuit 502 has a plurality of control commands, and the control commands are executed to perform operations of data writing, reading, erasing, etc. when the memory storage apparatus 10 is operating.

In the present exemplary embodiment, the control commands of the memory management circuit 502 are implemented in a firmware form. For example, the memory management circuit 502 includes a microprocessor unit (not illustrated) and a read only memory (not illustrated), wherein the control commands are burnt into a read-only memory. When the memory storage apparatus 10 is operating, the control commands are executed by the microprocessor unit to perform operations of data writing, reading, erasing, etc.

In another exemplary embodiment of the disclosure, the control commands of the memory management circuit 502 may also be stored in a specific area (e.g., the system area in the memory module exclusively used for storing system data) of the rewritable non-volatile memory module 406 in the form of program codes. In addition, the memory management circuit 502 includes a microprocessor unit (not illustrated), a read only memory (not illustrated), and a random access memory (not illustrated). Particularly, the read only memory has a boot code, which is executed by the microprocessor unit to load the control commands stored in the rewritable non-volatile memory module 406 to the random access memory of the memory management circuit 502 when the memory control circuit unit 404 is enabled. Afterwards, the control commands are run by the microprocessor unit to perform operations of data writing, reading, erasing, etc.

Furthermore, in another exemplary embodiment of the disclosure, the control commands of the memory management circuit 502 may also be implemented in a hardware form. For example, the memory management circuit 502 includes a microprocessor, a memory cell management circuit, a memory writing circuit, a memory reading circuit, a memory erasing circuit, and a data processing circuit. The memory cell management circuit, the memory writing circuit, the memory reading circuit, the memory erasing circuit, and the data processing circuit are coupled to the microprocessor. Specifically, the memory cell management circuit is configured to manage the physical erasing units of the rewritable non-volatile memory module 406. The memory writing circuit is configured to issue a write command to the rewritable non-volatile memory module 406 for writing data to the rewritable non-volatile memory module 406. The memory reading circuit is configured to issue a read command to the rewritable non-volatile memory module 406 for reading data from the rewritable non-volatile memory module 406. The memory erasing circuit is configured to issue an erase command to the rewritable non-volatile memory module 406 for erasing data from the rewritable non-volatile memory module 406. The data processing circuit is configured to process data to be written to the rewritable non-volatile memory module 406 and data read from the rewritable non-volatile memory module 406.

The host interface 504 is coupled to the memory management circuit 502 and is configured to couple to the connection interface unit 402 to receive and identify the commands and the data transmitted by the host system 11. In other words, the commands and the data transmitted by the host system 11 are transmitted to the memory management circuit 502 via the host interface 504. In the present exemplary embodiment, the host interface 504 is compatible with the SATA standard. However, it is understood that the disclosure is not limited hereto, and the host interface 504 may also be compatible with the PATA standard, the IEEE 1394 standard, the PCI Express standard, the USB standard, the UHS-I interface standard, the UHS-II interface standard, the SD standard, the MS standard, the MMC standard, the CF standard, the IDE standard, or other suitable data transmission standards.

The memory interface 506 is coupled to the memory management circuit 502 and is configured to access the rewritable non-volatile memory module 406. In other words, data to be written to the rewritable non-volatile memory module 406 are converted into a format acceptable by the rewritable non-volatile memory module 406 through the memory interface 506.

In an exemplary embodiment, the memory control circuit unit 404 further includes a buffer memory 508, a power management circuit 512, and an error checking and correcting (ECC) circuit 512.

The buffer memory 508 is coupled to the memory management circuit 502 and is configured to temporarily store data and commands from the host system 11 or data from the rewritable non-volatile memory module 406.

The power management circuit 510 is coupled to the memory management circuit 502 and is configured to control a power of the memory storage apparatus 10.

The error checking and correcting circuit 512 is coupled to the memory management circuit 502 and is configured to execute an error checking and correcting procedure to ensure correctness of data. Specifically, when the memory management circuit 502 receives a write command from the host system 11, the error checking and correcting circuit 512 generates an error checking and correcting code (ECC Code) for the data corresponding to the write command, and the memory management circuit 502 writes the data corresponding to the write command and the corresponding error checking and correcting code to the rewritable non-volatile memory module 406. Afterwards, when reading the data from the rewritable non-volatile memory module 406, the memory management circuit 502 simultaneously reads the error checking and correcting code corresponding to the data, and the error checking and correcting circuit 512 executes the error checking and correcting procedure on the read data according to the error checking and correcting code.

In the present exemplary embodiment, the error checking and correcting circuit 512 is implemented by a low-density parity-check (LDPC) code. However, in another exemplary embodiment, the error checking and correcting circuit 512 may also be implemented by encoding/decoding algorithms including a BCH code, a convolutional code, a turbo code, bit flipping, etc.

Specifically, the memory management circuit 502 generates an error correcting code frame (ECC frame) according to the received data and the corresponding error checking and correcting code (hereinafter also referred to as an error correcting code) and writes the error correcting code frame to the rewritable non-volatile memory module 406. Afterwards, when the memory management circuit 502 reads the data from the rewritable non-volatile memory module 406, the error checking and correcting circuit 512 verifies correctness of the read data according to the error correcting code in the error correcting code frame.

In descriptions hereinafter, the operations performed by the memory management circuit 502, the host interface 504, the memory interface 506, the buffer memory 508, the power management circuit 510, and the error checking and correcting circuit 512 may also be referred to as performed by the memory control circuit unit 404. It is noted that in the following description, some terms may be replaced with corresponding abbreviations for ease of reading (see Table 1).

TABLE 1

| | |
|---|---|
| rewritable non-volatile memory module | RNVM module |
| physical erasing unit | PEU |
| physical programming unit | PPU |
| logical erasing unit | LEU |
| logical programming unit | LPU |
| memory management circuit | MMC |
| memory control circuit | MCC |
| garbage collection operation | GCO |
| valid data count | VDC |

Figure 6:
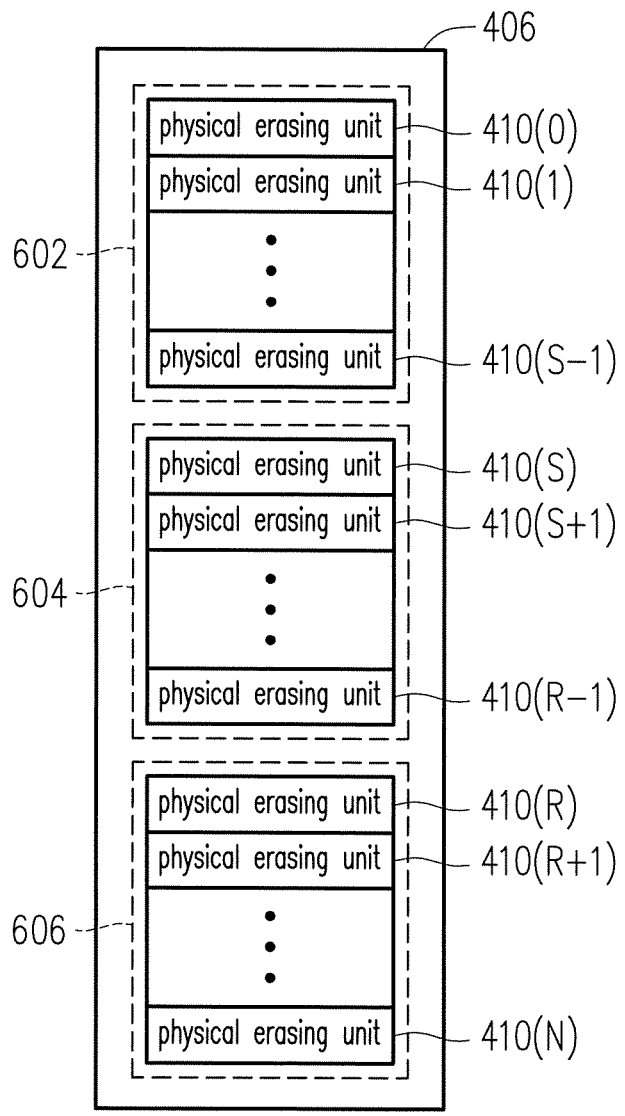
FIG. 6 and FIG. 7 are exemplary schematic diagrams illustrating management of physical erasing units according to an exemplary embodiment.
Figure 7:
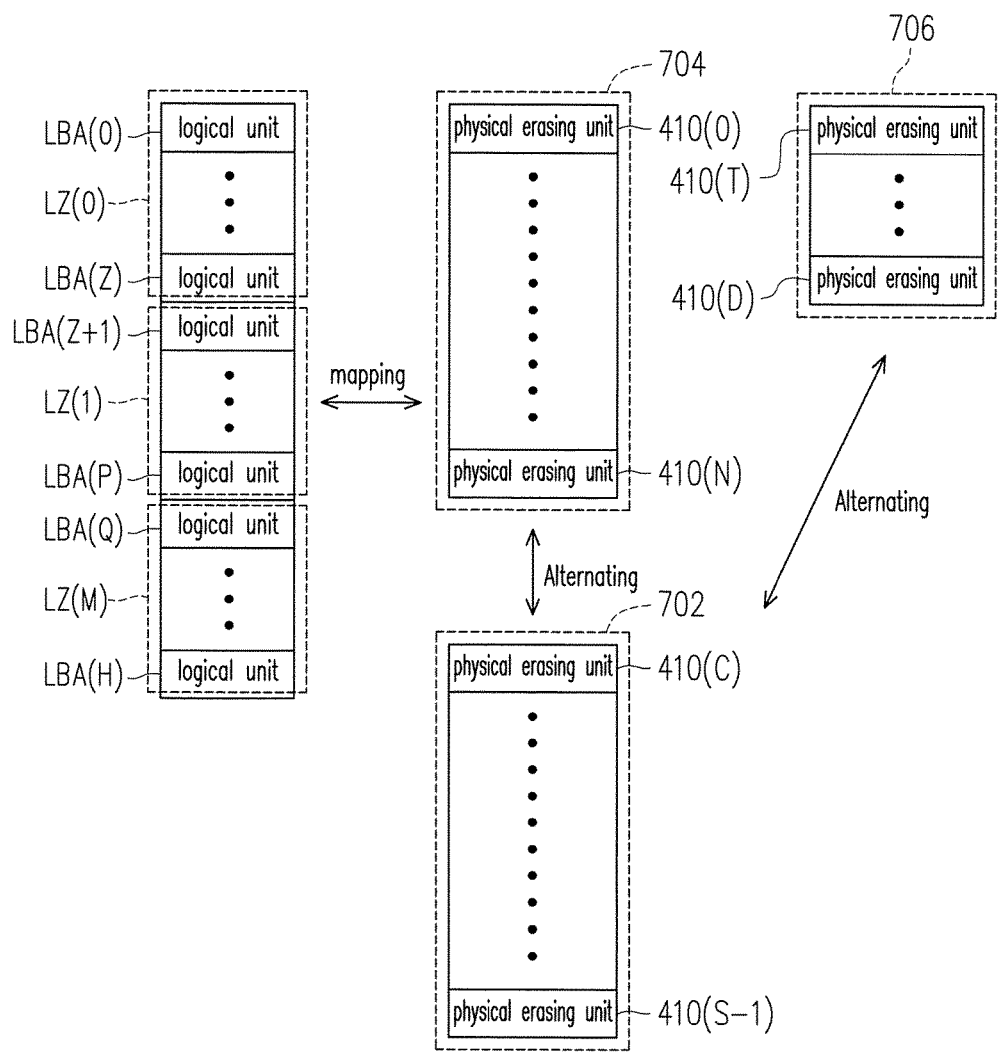

FIG. 6 and FIG. 7 are exemplary schematic diagrams illustrating management of PEUs according to an exemplary embodiment.

It is understood that in the description of operations of the PEUs of the RNVM module 406 here, temis such as "get", "retrieve", "group", "divide", "associate", etc. that describe operations of the PEUs are logical concepts. In other words, actual positions of the PEUs of the RNVM module are not changed, but the PEUs of the RNVM module are logically operated.

Generally, before the memory storage apparatus 10 leaves the factory, a manufacturer performs an initializing operation on the memory storage apparatus 10 using a Mass Production tool (MP tool) so as to perform an initialization. Referring to FIG. 6, for example, the MMC 502 performs the initialization to logically group the PEUs 410(0) to 410(N) into a system area 604, a replacement area 606, and a storage area 602.

The PEUs logically belonging to the system area 604 are configured to record system data. For example, the system data include information related to the manufacturer and model of the RNVM module, the number of the PEUs of the RNVM module, the number of the PPUs in each PEU, and so forth.

The PEUs logically belonging to the replacement area 606 are used in a bad PEU replacement procedure to replace damaged PEUs. Specifically, if the replacement area 606 still includes normal PEUs when PEUs in the storage area 602 are damaged, the MMC 502 gets the noinial PEUs from the replacement area 606 to replace the damaged PEUs.

Among the PEUs logically belonging to the storage area 602, empty PEUs are associated with a spare area 702 at the time of initializing. When receiving a write command and data to be written (also referred to as user data) from the host system 11, the MMC 502 retrieves a PEU from the spare area 702 and issues a command sequence to write the data to the retrieved PEU and associate the PEU (hereinafter also referred to as a first PEU) written with the user data with a data area 704. When the data in the PEU in the data area 704 are all invalid data, this PEU is re-associated with the spare area 702. In other words, the PEUs in the spare area 702 constantly alternate to be used for writing the user data.

Since the PEUs in the spare area 702 alternately store the user data, the MMC 502 configures logical units LBA(0) to LBA(H) for mapping to the PEUs in the data area 502, wherein each logical unit includes a plurality of logical sub-units for mapping to the PPUs of the corresponding PEU. In the present exemplary embodiment, the logical sub-units may be logical pages or logical sectors. Particularly, the MMC 502 gets a PEU from the spare area 702 for storing a logical address-physical address mapping table to record mapping relationships between the logical units and the PPUs in the data area. The PEU (hereinafter also referred to as a second PEU) storing the logical address-physical address mapping table is associated with the table area 706. In other words, when writing data, the MMC 502 loads the logical address-physical address mapping table to the buffer memory 508 for updating, and then stores the updated logical address-physical address mapping table to the PEU in the table area 706. Similarly, when the data in the PEU in the table area 706 are all invalid, this PEU is re-associated with the spare area 702. In other words, the PEUs in the spare area 702 constantly alternate to be used for writing the management table data.

It shall be mentioned that since a capacity of the buffer memory 508 is limited and cannot store a mapping table recording the mapping relationships of all of the logical units, in the present exemplary embodiment, the MMC 502 groups the logical units LBA(0) to LBA(H) into a plurality of logical zones LZ(0) to LZ(M) and configures one logical address-physical address mapping table for each logical zone. Particularly, when the MMC 502 is to update the mapping of a logical unit, the logical address-physical address mapping table corresponding to the logical zone to which this logical unit belongs is loaded to the buffer memory 508 to be updated.

In the present exemplary embodiment, the MMC 502 constantly monitors the number of the PEUs associated with the data area 704, and if the number of the PEUs associated with the data area 704 is larger than a first threshold, the MMC 502 performs a first GCO (also referred to as a first valid data merge operation) on the PEUs in the data area 704. Specifically, the MMC 502 selects a plurality of PEUs (e.g., a PEU 410(0) and a PEU 410(1)) from the data area 704, copies the valid data on the PEUs to a PEU 410(F) (hereinafter also referred to as a third PEU) gotten from the spare area 702, and then re-associates the PEUs that do not store valid data in the data area 704 with the spare area 702. In the present exemplary embodiment, the first threshold is a fixed value. For example, in the case where, at the time of initializing, 1,000 PEUs are configured in the spare area 702 and 980 PEUs are reserved for writing the user data, the first threshold is set at 960.

In the present exemplary embodiment, the MMC 502 constantly monitors the number of the PEUs associated with the table area 706, and if the number of the PEUs associated with the table area 706 is larger than a second threshold, the MMC 502 performs a second GCO (also referred to as a second valid data merge operation) on the PEUs in the table area 706. Specifically, the MMC 502 selects a plurality of PEUs (e.g., a PEU 410(T) and a PEU 410(T+1)) from the table area 706, copies the valid data on the PEUs to a PEU 410(F+1) (hereinafter also referred to as a fourth PEU) gotten from the spare area 702, and then re-associates the PEUs that do not store valid data in the table area 706 with the spare area 702. In the present exemplary embodiment, the second threshold is smaller than the first threshold and is dynamically adjusted according to the number of the PEUs in the data area 704, wherein the second threshold decreases as the number of the PEUs in the data area 704 increases and is not smaller than a predetermined value. For example, in the case where, at the time of initializing, 1,000 PEUs are configured in the spare area 702 and 20 PEUs are reserved for writing the management table data, the second threshold is initially set at 100 and is gradually decreased to the predetermined value as the number of the PEUs in the data area 704 increases, wherein the predetermined value is set at 18. In other words, with the spare area 702 originally containing many empty PEUs, the MMC 502 temporarily uses part of the PEUs originally reserved for the data area 704 to store the management table data, and as the PEUs available in the spare area 702 decrease, the second GCO is then performed to re-associate the PEUs that do not store valid data in the table area 706 with the spare area 702. Particularly, since an amount of the management table data is less, when the second GCO is performed, the PEUs that do not store valid data in the table area 706 are quickly found, thereby completing the second GCO.

Figure 8:
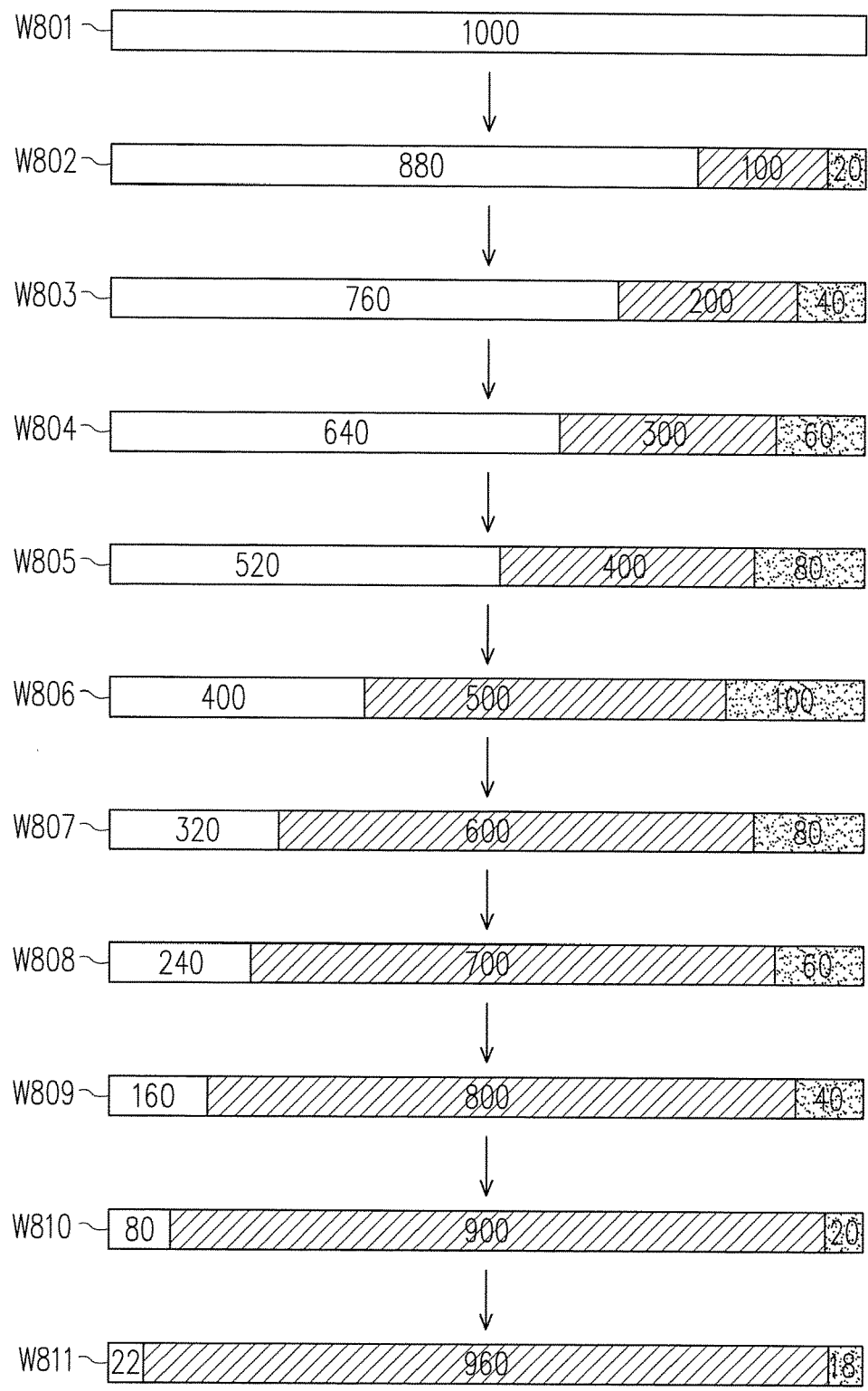
FIG. 8 is a schematic diagram illustrating performing a writing operation according to an exemplary embodiment.

FIG. 8 is a schematic diagram illustrating performing a writing operation according to an exemplary embodiment.

Referring to FIG. 8, for ease of illustration, it is supposed here that the MMC 502 configures 1,000 PEUs in the spare area 702 at the time of initialization, wherein 980 PEUs are reserved for writing the user data, 20 PEUs are reserved for writing the management table data, the first threshold is fixedly set at 960, the second threshold is initially set at 100, and a lower bound value (i.e., the predetermined value mentioned above) of the second threshold is set at 18.

After initializing is completed, the spare area 702 contains 1,000 PEUs (as indicated by the blank strip in a writing operation W801). Then, a fixed size of the data (also referred to as the user data) written by the host system 11 each time is equivalent to a capacity of 100 PEUs, and 20 PEUs are required to store the management table data (e.g., the updated logical address-physical address mapping table) corresponding to the user data. As indicated by a writing operation W802, the MMC 502 selects 100 PEUs from the spare area 702 for writing the user data and selects 20 PEUs for writing the management table data. Since the number of the PEUs (as indicated by a slant line region) in the data area 704 is smaller than the first threshold, it is not necessary to perform the first GCO. Moreover, since the number of the PEUs (as indicated by a dotted region) in the table area 706 is smaller than the second threshold, it is not necessary to perform the second GCO. Operations of a writing operation W803 to a writing operation W806 are similar to that of the writing operation W802 and are thus not repeatedly described here.

Next, when the host system 11 continues writing data, as indicated by a writing operation W807, the MMC 502 further selects 100 PEUs from the spare area 702 for writing the user data and selects 20 PEUs for writing the management table data. Since the number of the PEUs (as indicated by the slant line region) in the data area 704 is 600 and is not larger than the first threshold, it is not necessary to perform the first GCO. Particularly, since the number of the PEUs in the data area 704 is already increased to 600, the MMC 502 adjusts the second threshold to 80 (namely, limiting the number of the PEUs in the table area 706 from exceeding 80). After the second threshold is adjusted, since the number of the PEUs in the table area 706 is larger than the second threshold, it is necessary to perform the second GCO to re-associate the PEUs that do not store valid data in the table area 706 with the spare area 702. Operations of a writing operation W808 to a writing operation W810 are similar to that of the writing operation W807 and are thus not repeatedly described here.

Afterwards, when the host system 11 continues writing data, as indicated by a writing operation W811, the MMC 502 further selects PEUs from the spare area 502 for writing the user data and selects PEUs for writing the management table data. In the course of writing the user data, the number of the PEUs in the data area 704 becomes larger than the first threshold, so it is necessary to perform the first GCO to keep the number of the PEUs in the data area 704 from being larger than the first threshold (i.e., 960). Moreover, since the number of the PEUs in the data area 704 already reaches the upper bound (i.e., 960), the MMC 502 adjusts the second threshold to 18 (namely, limiting the number of the PEUs in the table area 706 from exceeding 18). After the second threshold is adjusted, in the course of writing the management table data, since the number of the PEUs in the table area 706 is larger than the second threshold, it is necessary to perform the second GCO to keep the number of the PEUs in the table area 706 from being larger than the second threshold (i.e., 18).

In the foregoing example, the initial value of the second threshold is set at one tenth of the number of the PEUs in the spare area 702 after initializing, and after the number of the PEUs in the data area 704 exceeds a half of the number of the PEUs in the spare area 702 after initializing, the second threshold is decreased by 20% of the initial value each time the number of the PEUs in the data area 704 is increased by one tenth of the initial number of the PEUs in the spare area 702. However, it is understood that the above is merely an example and the disclosure is not limited thereto.

Figure 9:
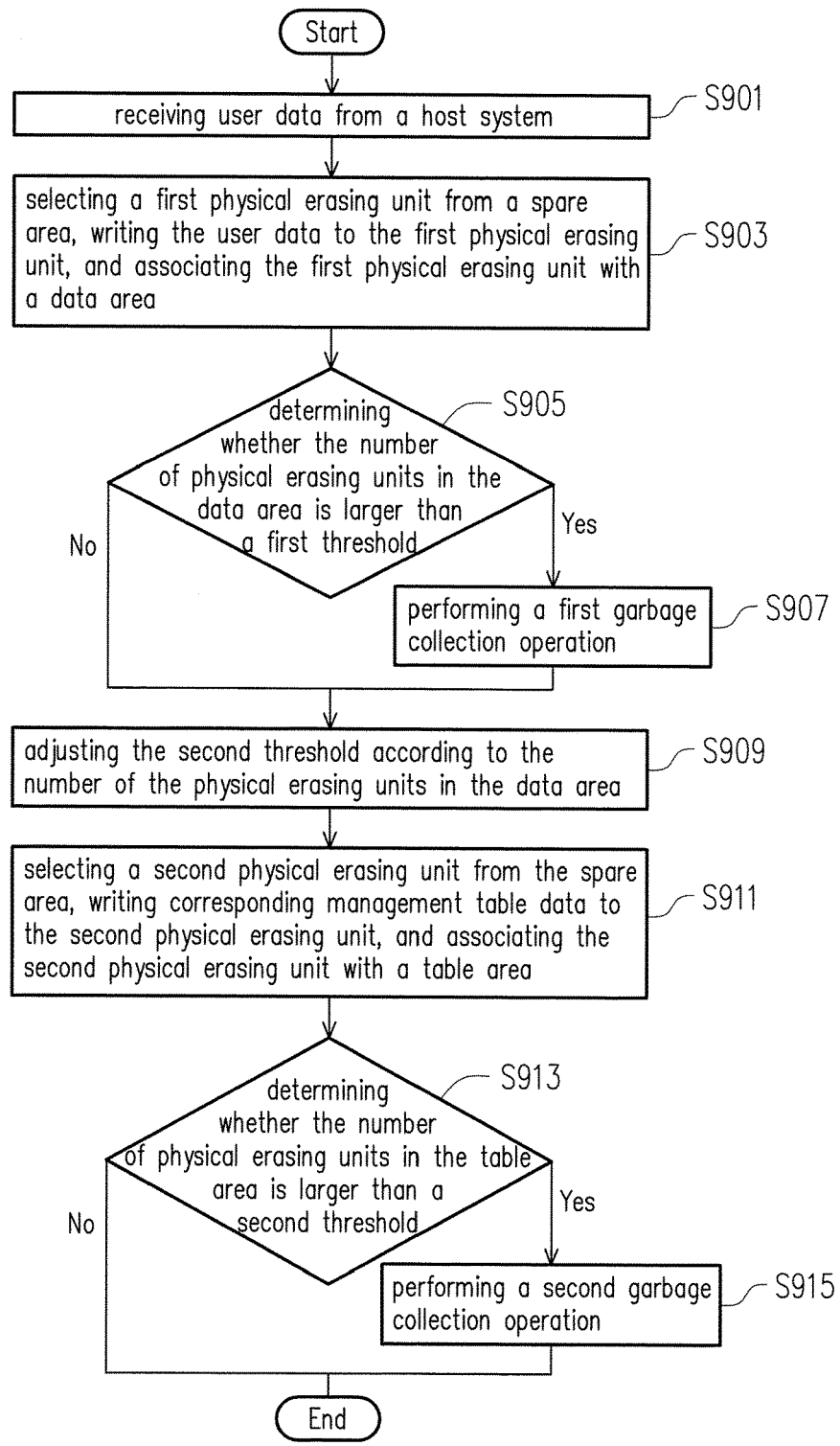
FIG. 9 is a flowchart illustrating a memory management method according to an exemplary embodiment.

FIG. 9 is a flowchart illustrating a memory management method according to an exemplary embodiment.

In step S901, a MMC 502 receives user data from a host system 11.

In step S903, the MMC 502 selects one PEU (hereinafter referred to as a first PEU) from a spare area 702, writes the user data to the first PEU, and associates the first PEU with a data area 704.

In step S905, the MMC 502 determines whether the number of PEUs in the data area 704 is larger than a first threshold. Here, the first threshold is a predetermined fixed value.

If the number of the PEUs in the data area 704 is larger than the first threshold, in step S907, the MMC 502 performs a first GCO.

Then, in step S909, the MMC 502 adjusts the second threshold according to the number of the PEUs in the data area 704.

Next, in step S911, the MMC 502 selects one PEU (hereinafter referred to as a second PEU) from the spare area 702, writes corresponding management table data to the second PEU, and associates the second PEU with a table area 706.

In step S913, the MMC 502 determines whether the number of PEUs in the table area 706 is larger than the second threshold.

If the number of the PEUs in the table area 706 is larger than the second threshold, in step S915, the MMC 502 performs a second GCO.

In summary of the above, the memory management method, the MCC unit, and the memory storage apparatus of the exemplary embodiments of the disclosure adaptively start the GCOs on the PEUs used for storing the tables according to the usage amount of the RNVM module. Accordingly, the disclosure prevents the GCOs from being executed and affecting the performance of executing the write commands by the memory storage apparatus, when a large quantity of space is still available in the RNVM module. The previously described exemplary embodiments of the present invention have the advantages aforementioned, wherein the advantages aforementioned not required in all versions of the invention.

Although the invention is disclosed as the embodiments above, the embodiments are not meant to limit the invention. Any person skilled in the art may make slight modifications and variations without departing from the spirit and scope of the invention. Therefore, the protection scope of the invention shall be defined by the claims attached below.

What is claimed is:

1. A memory management method for a rewritable non-volatile memory module, the rewritable non-volatile memory module comprising a plurality of physical erasing units associated at least with a data area, a spare area, or a table area, the memory management method comprising:
    performing a first garbage collection operation corresponding to the data area if a number of the physical erasing units associated with the data area is larger than a first threshold;
    performing a second garbage collection operation corresponding to the table area if a number of the physical erasing units associated with the table area is larger than a second threshold; and
    dynamically adjusting the second threshold according to the number of the physical erasing units associated with the data area.

2. The memory management method according to claim 1, wherein the second threshold decreases as the number of the physical erasing units in the data area increases and the second threshold is not smaller than a predetermined value.

3. The memory management method according to claim 1, wherein the second threshold is smaller than the first threshold, and the first threshold is a fixed value.

4. The memory management method according to claim 1, further comprising:
    monitoring whether the number of the physical erasing units associated with the data area is larger than the first threshold; and
    monitoring whether the number of the physical erasing units associated with the table area is larger than the second threshold.

5. The memory management method according to claim 1, further comprising:
    selecting a first physical erasing unit from the spare area, writing user data to the first physical erasing unit, and associating the first physical erasing unit with the data area; and
    selecting a second physical erasing unit from the spare area, writing management table data to the second physical erasing unit, and associating the second physical erasing unit with the table area.

6. The memory management method according to claim 5, wherein the step of performing the first garbage collection operation corresponding to the data area comprises:
    selecting a third physical erasing unit from the spare area, copying all valid data on at least two physical erasing units in the data area to the third physical erasing unit, re-associating the at least two physical erasing units in the data area with the spare area, and associating the third physical erasing unit with the data area.

7. The memory management method according to claim 6, wherein the step of performing the second garbage collection operation corresponding to the table area comprises:
    selecting a fourth physical erasing unit from the spare area, copying all valid data on at least two physical erasing units in the table area to the fourth physical erasing unit, re-associating the at least two physical erasing units in the table area with the spare area, and associating the fourth physical erasing unit with the table area.

8. A memory control circuit unit configured to control a rewritable non-volatile memory module, the memory control circuit unit comprising:
    a host interface configured to couple to a host system;
    a memory interface configured to couple to the rewritable non-volatile memory module, wherein the rewritable non-volatile memory module comprises a plurality of physical erasing units; and
    a memory management circuit coupled to the host interface and the memory interface,
    wherein the memory management circuit is configured to associate the plurality of physical erasing units at least with a data area, a spare area, or a table area,
    wherein the memory management circuit is further configured to perform a first garbage collection operation corresponding to the data area if a number of the physical erasing units associated with the data area is larger than a first threshold,
    wherein the memory management circuit is further configured to perform a second garbage collection operation corresponding to the table area if a number of the physical erasing units associated with the table area is larger than a second threshold,
    wherein the memory management circuit is further configured to dynamically adjust the second threshold according to the number of the physical erasing units associated with the data area.

9. The memory control circuit unit according to claim 8, wherein the second threshold decreases as the number of the physical erasing units in the data area increases and the second threshold is not smaller than a predetermined value.

10. The memory control circuit unit according to claim 8, wherein the second threshold is smaller than the first threshold, and the first threshold is a fixed value.

11. The memory control circuit unit according to claim 8, wherein the memory management circuit is further configured to monitor whether the number of the physical erasing units associated with the data area is larger than the first threshold, and monitor whether the number of the physical erasing units associated with the table area is larger than the second threshold.

12. The memory control circuit unit according to claim 8, wherein the memory management circuit is further configured to select a first physical erasing unit from the spare area and issue a command sequence to write user data to the first physical erasing unit and associate the first physical erasing unit with the data area, wherein the memory management circuit is further configured to select a second physical erasing unit from the spare area and issue another command sequence to write management table data to the second physical erasing unit and associate the second physical erasing unit with the table area.

13. The memory control circuit unit according to claim 12, wherein in the operation of performing the first garbage collection operation corresponding to the data area, the memory management circuit selects a third physical erasing unit from the spare area, copies all valid data on at least two physical erasing units in the data area to the third physical erasing unit, re-associates the at least two physical erasing units in the data area with the spare area, and associates the third physical erasing unit with the data area.

14. The memory control circuit unit according to claim 13, wherein in the operation of performing the second garbage collection operation corresponding to the table area, the memory management circuit selects a fourth physical erasing unit from the spare area, copies all valid data on at least two physical erasing units in the table area to the fourth physical erasing unit, re-associates the at least two physical erasing units in the table area with the spare area, and associates the fourth physical erasing unit with the table area.

15. A memory storage apparatus comprising:
a connector configured to couple to a host system;
a rewritable non-volatile memory module comprising a plurality of physical erasing units; and
a memory control circuit unit coupled to the connector and the rewritable non-volatile memory module,
wherein the memory control circuit unit is configured to associate the plurality of physical erasing units at least with a data area, a spare area, or a table area,
wherein the memory control circuit unit is further configured to perform a first garbage collection operation corresponding to the data area if a number of the physical erasing units associated with the data area is larger than a first threshold,
wherein the memory control circuit unit is further configured to perform a second garbage collection operation corresponding to the table area if a number of the physical erasing units associated with the table area is larger than a second threshold, wherein the memory control circuit unit is further configured to dynamically adjust the second threshold according to the number of the physical erasing units associated with the data area.

16. The memory storage apparatus according to claim 15, wherein the second threshold decreases as the number of the physical erasing units in the data area increases and the second threshold is not smaller than a predetermined value.

17. The memory storage apparatus according to claim 15, wherein the second threshold is smaller than the first threshold, and the first threshold is a fixed value.

18. The memory storage apparatus according to claim 15, wherein the memory control circuit unit is further configured to monitor whether the number of the physical erasing units associated with the data area is larger than the first threshold, and monitor whether the number of the physical erasing units associated with the table area is larger than the second threshold.

19. The memory storage apparatus according to claim 15, wherein the memory control circuit unit is further configured to select a first physical erasing unit from the spare area, write user data to the first physical erasing unit, and associate the first physical erasing unit with the data area, wherein the memory control circuit unit is further configured to select a second physical erasing unit from the spare area, write management table data to the second physical erasing unit, and associate the second physical erasing unit with the table area.

20. The memory storage apparatus according to claim 19, wherein in the operation of performing the first garbage collection operation corresponding to the data area, the memory control circuit unit selects a third physical erasing unit from the spare area, copies all valid data on at least two physical erasing units in the data area to the third physical erasing unit, re-associates the at least two physical erasing units in the data area with the spare area, and associates the third physical erasing unit with the data area.

21. The memory storage apparatus according to claim 20, wherein in the operation of performing the second garbage collection operation corresponding to the table area, the memory control circuit unit selects a fourth physical erasing unit from the spare area, copies all valid data on at least two physical erasing units in the table area to the fourth physical erasing unit, re-associates the at least two physical erasing units in the table area with the spare area, and associates the fourth physical erasing unit with the table area.

* * * * *